United States Patent
Furukawa

(10) Patent No.: US 7,126,367 B2
(45) Date of Patent: Oct. 24, 2006

(54) TEST APPARATUS, TEST METHOD, ELECTRONIC DEVICE, AND ELECTRONIC DEVICE MANUFACTURING METHOD

(75) Inventor: Yasuo Furukawa, Tokyo (JP)

(73) Assignee: Advantest Corporation (JP)

( * ) Notice: Subject to any disclaimer, the term of this patent is extended or adjusted under 35 U.S.C. 154(b) by 0 days.

(21) Appl. No.: 11/006,868

(22) Filed: Dec. 8, 2004

(65) Prior Publication Data

US 2006/0076970 A1 Apr. 13, 2006

(30) Foreign Application Priority Data

Oct. 12, 2004 (JP) ............................. 2004-298260

(51) Int. Cl.
*G01R 31/26* (2006.01)
*G01R 31/28* (2006.01)

(52) U.S. Cl. ...................................... 324/765
(58) Field of Classification Search .................. 326/83
See application file for complete search history.

(56) References Cited

U.S. PATENT DOCUMENTS

| 4,394,590 | A | * | 7/1983 | Honda | 327/436 |
| 4,447,745 | A | * | 5/1984 | Takemae et al. | 327/292 |
| 2002/0036534 | A1 | | 3/2002 | Kouno et al. | |
| 2003/0067318 | A1 | | 4/2003 | Takahashi et al. | |

FOREIGN PATENT DOCUMENTS

EP 1 118 867 A1 7/2001

OTHER PUBLICATIONS

Kobayashi, T. and Sakurai, T., "Self-Adjusting Threshold-Voltage Scheme (SATs) for Low-Voltage High-Speed Operation." Proc. IEEE 1994 Custom Integrated Circuits Conference, pp. 271-274, May 1994, 4 pages.
PCT International Search Report issued for International application No.: PCT/JP2005/018710 mailed on Jan. 10, 2006, 7 pages.

* cited by examiner

*Primary Examiner*—Vinh Nguyen
*Assistant Examiner*—Trung Q. Nguyen
(74) *Attorney, Agent, or Firm*—Osha Liang LLP

(57) ABSTRACT

A test apparatus for testing an electronic device provided with a field effect transistor, which operates in response to a given test pattern, is provided, wherein the test apparatus includes a power supply for providing electric power which drives the electronic device, a pattern generating unit for generating a plurality of test patterns sequentially and providing the electronic device with the test patterns, a leak current detecting unit for detecting a leak current of the field effect transistor, a voltage control unit for controlling a substrate voltage applied to a substrate on which the field effect transistor is provided, in order to maintain the leak current detected by the leak current detecting unit at a predetermined value, and a power supply current measuring unit for measuring a power supply current input to the electronic device at every time when each of the test patterns is applied and deciding acceptability of the electronic device on the basis of the measured power supply currents.

5 Claims, 8 Drawing Sheets

TEST APPARATUS, TEST METHOD, ELECTRONIC DEVICE, AND ELECTRONIC DEVICE MANUFACTURING METHOD

BACKGROUND OF THE INVENTION

1. Field of the Invention

The present invention relates to a test apparatus and a test method for testing an electronic device in which a field effect transistor is provided, an electronic device in which a field effect transistor operating in response to a given test pattern is provided and a method for manufacturing the device. More particularly, the present invention relates to a test apparatus and a test method for reducing influence of the change of a leak current in the field effect transistor during the test.

2. Description of the Related Art

Conventionally, as a method for testing an electronic device such as semiconductor circuit, a method for measuring a power supply current supplied for the electronic device and detecting an abnormal value of the power supply current has been known. For example, a variety of test patterns are applied to the electronic device, the power supply current is detected in various operating states and the acceptability of the electronic device is decided on the basis of whether the power supply current is within a predetermined range or not.

Since related patent documents have not been found up to the present, the description regarding the documents is omitted.

However, the leak current in the electronic device has been increased due to miniaturization of the electronic device or increase of the number of CMOS included in the electronic device. The leak current changes according to differences among the electronic devices or the change of the temperature. Particularly, for the CMOS, the so-called sub-threshold leak current has high temperature dependence and it is difficult to stabilize the sub-threshold leak current. For this reason, the power supply current supplied to the electronic device changes according to the change of the leak current and the conventional power supply current test has a problem of deciding that an electronic device which has no defect is defective.

Further, regarding the above problem, the method for providing the electronic device with a temperature sensor and a heater and controlling the temperature of the electronic device to be constant has been known. However, this kind of control cannot perform a precise control and make the change of the leak current sufficiently small.

SUMMARY OF THE INVENTION

Therefore, it is an object of the present invention to provide a test apparatus, a test method, an electronic device and a method for manufacturing the device, which are capable of overcome the above drawbacks. The above and other objects can be achieved by combinations described in the independent claims. The dependent claims define further advantageous and exemplary combinations of the present invention.

According to the first aspect of the present invention, a test apparatus for testing an electronic device provided with a field effect transistor, which operates in response to a given test pattern, is provided, wherein the test apparatus includes a power supply for providing electric power which drives the electronic device, a pattern generating unit for generating a plurality of test patterns sequentially and providing the electronic device with the test patterns, a leak current detecting unit for detecting a leak current of the field effect transistor, a voltage control unit for controlling a substrate voltage applied to a substrate on which the field effect transistor is provided, in order to maintain the leak current detected by the leak current detecting unit at a predetermined value, and a power supply current measuring unit for measuring a power supply current input to the electronic device at every time when each of the test patterns is applied and deciding acceptability of the electronic device on the basis of the measured power supply currents.

The leak current detecting unit may measure a p-type leak current of the field effect transistor of p-type and an n-type leak current of the field effect transistor of n-type, and the voltage control unit controls a high voltage applied to the substrate on the basis of the p-type leak current and a low voltage applied to the substrate on the basis of the n-type leak current.

The power supply current measuring unit may array the measured power supply currents with respect to each of the test patterns in the order of the magnitude of each of the power supply currents and decide that the electronic device is defective in case that the arrayed power supply currents are discontinuous.

The power supply current measuring unit may perform second-order differentiation of the arrayed power supply currents and decide that the electronic device is defective in case that a peak of the differentiated value is larger than a predetermined value. Further, the power supply current measuring unit may acquire differences between two adjacent power supply currents of the arrayed power supply currents and decide that the electronic device is defective in case that there is any acquired difference which is larger than a predetermined value.

According to the second aspect of the present invention, a method for testing an electronic device provided with a field effect transistor, which operates in response to a given test pattern, is provided, wherein the test method includes a power supplying step of providing electric power which drives the electronic device, a pattern generating step of generating a plurality of test patterns sequentially and providing the electronic device with the test patterns, a leak current detecting step of detecting a leak current of the field effect transistor, a voltage control step of controlling a substrate voltage applied to a substrate on which the field effect transistor is provided, in order to maintain the leak current detected during the leak current detecting step at a predetermined value, and a power supply current measuring step of measuring a power supply current input to the electronic device at every time when each of the test patterns is applied and deciding acceptability of the electronic device on the basis of the measured power supply currents.

According to the third aspect of the present invention, an electronic device provided with a field effect transistor, which operates in response to a given test pattern, is provided, wherein the electronic device includes a leak current detecting circuit for outputting a current, of which the value is substantially equal to that of a leak current of the field effect transistor, to the outside.

The leak current detecting circuit may include a dummy transistor which has substantially the same characteristic as that of the field effect transistor. A power supply voltage of which the value is substantially equal to that of the power supply voltage applied to the field effect transistor is applied to the dummy transistor. A gate terminal and a source terminal of the dummy transistor are connected. Further, the dummy transistor outputs a drain current to the outside. The leak current detecting circuit may be provided independently from an input pin to which the test patterns are input.

The leak current detecting circuit may include the dummy transistor of n-type for outputting a leak current of which the value is substantially equal to that of the leak current of the field effect transistor of n-type to the outside, and said dummy transistor of p-type for outputting a leak current of which the value is substantially equal to that of the leak current of the field effect transistor of p-type to the outside.

The electronic device may include a power supply terminal for receiving electric power from an external power supply, and a substrate voltage terminal which is provided independently from the power supply terminal and receives a voltage applied to a substrate on which the field effect transistor is provided.

According to the fourth aspect of the present invention, a method for manufacturing an electronic device provided with a field effect transistor, which operates in response to a given test pattern, is provided, wherein the method includes a preparation step of preparing a substrate, a circuit formation step of forming the field effect transistor on the substrate, and a detecting circuit formation step of forming a leak current detecting circuit on the substrate, wherein the leak current detecting circuit outputs a current of which the value is substantially equal to that of a leak current of the field effect transistor to the outside.

According to the fifth aspect of the present invention, a test apparatus for testing an electronic device is provided, wherein the test apparatus includes a power supply for providing electric power which drives the electronic device, a pattern generating unit for generating a plurality of test patterns sequentially and providing the electronic device with the test patterns, and a power supply current measuring unit for measuring a power supply current input to the electronic device at every time when each of the test patterns is applied and deciding acceptability of the electronic device on the basis of the measured power supply currents. The pattern generating unit generates a reference test pattern of a predetermined pattern and supplies the reference test pattern to the electronic device at every time when each of the test patterns of a predetermined number is supplied to the electronic device. The power supply current measuring unit controls a power supply voltage applied to the electronic device by the power supply so that the power supply current at rest, which is supplied to the electronic device with correspondent to the reference test patterns at every time when each of the reference test patterns is supplied to the electronic device, has a predetermined value. The pattern generating unit may generate the test patterns and the reference test patterns alternately and supplies them to the electronic device.

According to the sixth aspect of the present invention, a method for testing an electronic device is provided, wherein the test method includes a power supplying step of providing electric power which drives the electronic device, a pattern generating step of generating a plurality of test patterns sequentially and providing the electronic device with the test patterns, a reference test pattern generating step of generating a reference test pattern of a predetermined pattern and supplying the reference test pattern to the electronic device at every time when each of the test patterns of a predetermined number is supplied to the electronic device during the pattern generating step, a power supply current measuring step of measuring a power supply current input to the electronic device at every time when each of the test patterns is applied and deciding acceptability of the electronic device on the basis of the measured power supply currents, a reference current measuring step of in measuring a power supply current supplied to the electronic device with correspondent to the reference test pattern at every time when each of the reference test patterns is supplied to the electronic device, and a power supply voltage control step of controlling a power supply voltage applied to the electronic device during the power supplying step so that the power supply current at rest, which is measured in the reference current measuring step, has a predetermined value.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows an example of power supply currents measured with respect to each of test patterns supplied to the electronic device 200.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
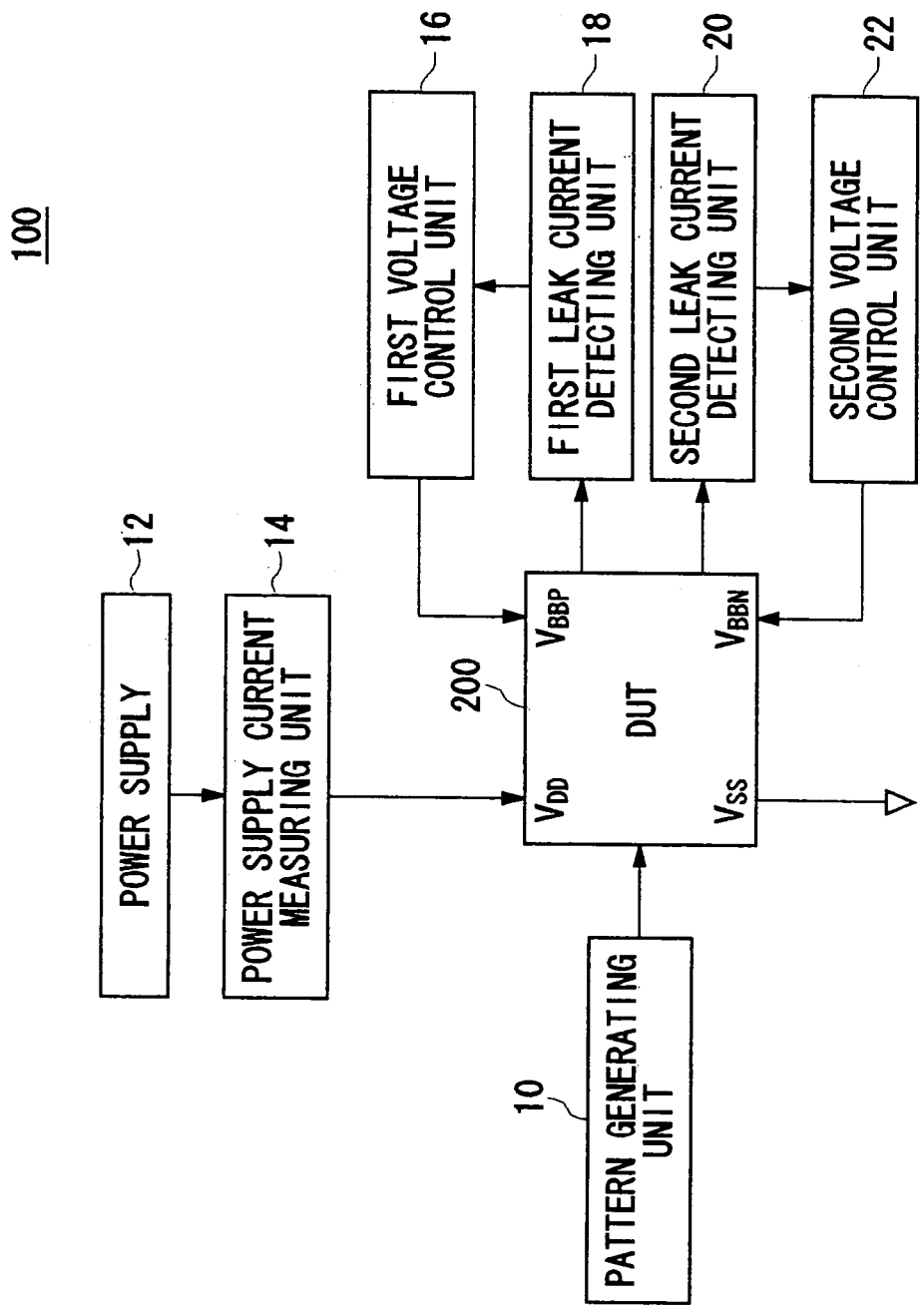
FIG. 1 shows an example of the configuration of a test apparatus 100 according to an embodiment of the present invention.

FIG. 1 shows an example of the configuration of a test apparatus 100 according to an embodiment of the present invention. The test apparatus 100 for testing an electronic device 200 provided with a field effect transistor includes a pattern generating unit 10, a power supply 12, a power supply current measuring unit 14, a first voltage control unit 16, a first leak current detecting unit 18, a second leak current detecting unit 20, and a second voltage control unit 22. According to the present example, the field effect transistor indicates a MOS-type field effect transistor.

The power supply 12 supplies electric power driving the electronic device 200. According to the present example, electric power of a constant voltage is supplied to the electronic device 200. Further, the pattern generating unit 10 generates a plurality of test patterns to be supplied to the electronic device 200 sequentially and supplies them to the electronic device 200. Accordingly, the pattern generating unit 10 makes the electronic device 200 in different operating states by supplying different test patterns sequentially. The power supply current measuring unit 14 detects the power supply currents supplied to the electronic device 200 by the power supply 12 at every time when each of the test patterns is applied. The power supply current measuring unit 14 may detect the power supply current at rest (IDDQ) of the electronic device 200.

The first leak current detecting unit 18 and the second leak current detecting unit 20 detect a leak current of the field effect transistor included in the electronic device 200. According to the present example, the first leak current detecting unit 18 detects a sub-threshold leak current per unit number of a p-type field effect transistor included in the electronic device 200 and the second leak current detecting unit 20 detects a sub-threshold leak current per unit number of a n-type field effect transistor included in the electronic device 200. The sub-threshold leak current is a leak current flowing between the channels of the field effect transistor.

Moreover, the first voltage control unit 16 and the second voltage control unit 22 control a substrate voltage applied to the substrate of the electronic device 200 in order to maintain the leak currents detected by the first second leak current detecting unit 18 and the second leak current detecting unit 20 at a predetermined value. Therefore, the substrate voltage is controlled in response to the change of the leak current. Here, the substrate indicates a semiconductor board on which semiconductor elements such as a field effect transistor are formed.

Usually, the first voltage (high voltage) is applied to a n-type board of the substrate in the electronic device 200 and the second voltage (low voltage) lower than the first voltage is applied to a p-type area (p-well). According to the present example, the first voltage control unit 16 controls the first voltage applied to the n-type board of the substrate in the electronic device 200 so that the leak current detected by the first leak current detecting unit 18 becomes constant. Thus, the leak current of the p-type field effect transistor included in the electronic device 200 is controlled to be constant.

Further, the second voltage control unit 22 controls the second voltage applied to the p-type area of the substrate in the electronic device 200 so that the leak current detected by the second leak current detecting unit 20 becomes constant. Thus, the leak current of the n-type field effect transistor included in the electronic device 200 is controlled to be constant.

According to this kind of operation, during the pattern generating unit 10 inputs the plurality of test patterns to the electronic device 200, the leak current of the field effect transistor included in the electronic device 200 is controlled to be constant. Thus, the power supply current measuring unit 14 decides acceptability of the electronic device 200 on the basis of the values of the power supply current measured at every test pattern. For example, the power supply current measuring unit 14 sorts the power supply currents measured with respect to each of the test patterns in the order of the magnitude of each of the power supply currents, acquires differences between the adjacent power supply currents, and decides that the electronic device 200 is defective in case that there is any acquired difference which is larger than a predetermined value.

According to the test apparatus 100 in the present example, the change of the sub-threshold leak current in the field effect transistor included in the electronic device 200 can be removed and the acceptability of the electronic device 200 can be decided precisely.

Figure 2:
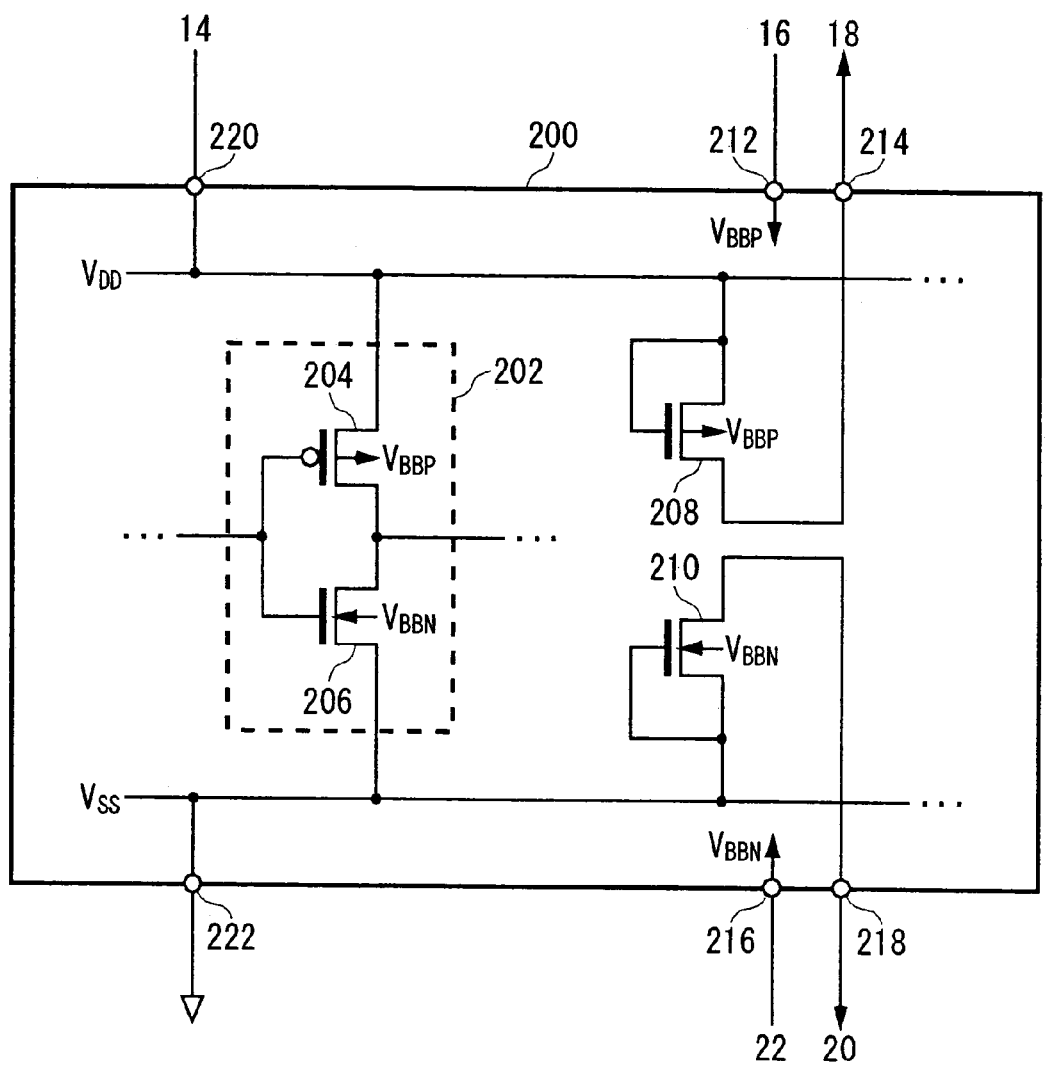
FIG. 2 shows an example of the configuration of an electronic device 200.

FIG. 2 shows an example of the configuration of the electronic device 200. The electronic device 200 includes a circuit unit to be tested 202 for operating in response to the given test pattern, a p-type dummy transistor 208, an n-type dummy transistor 210, power supply terminals 220 and 222, substrate voltage terminals 212 and 216, and leak current detecting terminals 214 and 218.

The power supply voltage $V_{DD}$ is applied to the power supply terminal 220 from the power supply 12 through the power supply current measuring unit 14. Further, the power supply voltage $V_{ss}$ is applied to the power supply terminal 222. According to the present example, the power supply terminal 222 is grounded.

Further, the substrate voltage terminals 212 and 216 are provided independently from the power supply terminals 220 and 222. The voltage ($V_{BBP}$) output from the first voltage control unit 16 is applied to the substrate voltage terminal 212 and the voltage ($V_{BBN}$) output from the second voltage control unit 22 is applied to the substrate voltage terminal 216. It is possible to control the substrate voltage of the electronic device 200 by providing the power supply terminal and the substrate terminal independently as above.

The circuit unit 202 to be tested is provided between a power line ($V_{DD}$) and a power line ($V_{ss}$) and supplied with the power supply voltage. The power supply voltage $V_{DD}$ is applied to the power line ($V_{DD}$) through the power supply terminal 220. Further, a voltage lower than that of the power line ($V_{DD}$) is applied to the power line ($V_{ss}$). According to the present example, the power line ($V_{ss}$) is grounded through the power supply terminal 222. Furthermore, the circuit unit 202 to be tested is provided with a plurality of the p-type field effect transistors 204 and then-type field effect transistors 206. A signal corresponding to the test pattern supplied to the electronic device 200 is given to the gate terminal of each field effect transistor 204 or 206 and the power supply current is consumed in response to the operating state.

The p-type dummy transistor 208 is formed to have substantially the same characteristic as that of the p-type field effect transistor 204 in the electronic device 200 and a power supply voltage of which the value is substantially equal to that of the power supply voltage applied to the p-type field effect transistor 204. According to the present example, the power supply voltage $V_{DD}$ is applied to the source terminal of the p-type dummy transistor 208.

The n-type dummy transistor 210 is formed to have substantially the same characteristic as that of the n-type field effect transistor 206 in the electronic device 200 and a power supply voltage of which the value is substantially equal to that of the power supply voltage applied to the n-type field effect transistor 204. According to the present example, the power supply voltage $V_{ss}$ is applied to the source terminal of the n-type dummy transistor 210.

Each of the dummy transistors 208 or 210, of which the gate terminal and the source terminal are short-circuited, outputs a drain current. The p-type dummy transistor 208 outputs the drain current to the first leak current detecting unit 18 through the leak current detecting terminal 214. Further, the n-type dummy transistor 210 outputs the drain current to the second leak current detecting unit 20 through the leak current detecting terminal 218. Furthermore, each of the dummy transistors 208 or 210 is provided independently from the input pin (which is not shown) to which the test pattern is input.

Since the dummy transistors 208 and 210 and the field effect transistors 204 and 206 have substantially the same characteristics and substantially equal power supply voltages and substrate voltages are applied, the drain currents output from the dummy transistors 208 and 210 are substantially the same as the leak currents of the corresponding field effect transistors 204 and 206. Accordingly, each of the dummy transistors 208 or 210 performs a function as the leak current detecting circuit in the present invention.

According to this configuration, the test apparatus 100 can detect the magnitude of the leak current per unit number of the field effect transistors in the electronic device 200. Therefore, the test apparatus 100 can keep the leak current of the field effect transistor included in the electronic device 200 constant by controlling the substrate voltage of the electronic device 200 on the basis of the leak current. For this reason, the test apparatus 100 can detect the power supply current precisely by supplying the test patterns sequentially and measuring the power supply currents while performing the control as above.

Further, although the electronic device 200 includes a pair of dummy transistors 208 and 210 in the present example, the electronic device 200 may include a plurality of pairs of dummy transistors 208 and 210 in another example. For example, the dummy transistors 208 and 210 may be distributed over the substrate substantially uniformly. In this case, the first leak current detecting unit 18 and the second leak current detecting unit 20 may acquire an average value of the currents output from the plurality of dummy transistors 208 and 210, respectively.

Furthermore, the electronic device 200 is manufactured by the method for manufacturing the device including a preparing step of preparing the substrate of the electronic device 200, a circuit formation step of forming the field effect transistors 204 and 206 on the substrate, and a detecting circuit formation step of forming the dummy transistors 208 and 210 on the substrate, which output substantially the same current as the leak currents of the field effect transistors 204 and 206 to the outside. The method for manufacturing the device may further include a formation step for forming the power supply terminals 220 and 222, the substrate voltage terminals 212 and 216, and the leak current detecting terminals 214 and 218 described above.

FIG. 3 shows an example of the power supply currents measured at every test pattern supplied to the electronic device 200. According to FIG. 3, the axis of abscissa shows the test patterns supplied to the electronic device 200 and the axis of ordinate shows the measured values of the power supply current.

Figure 3A:
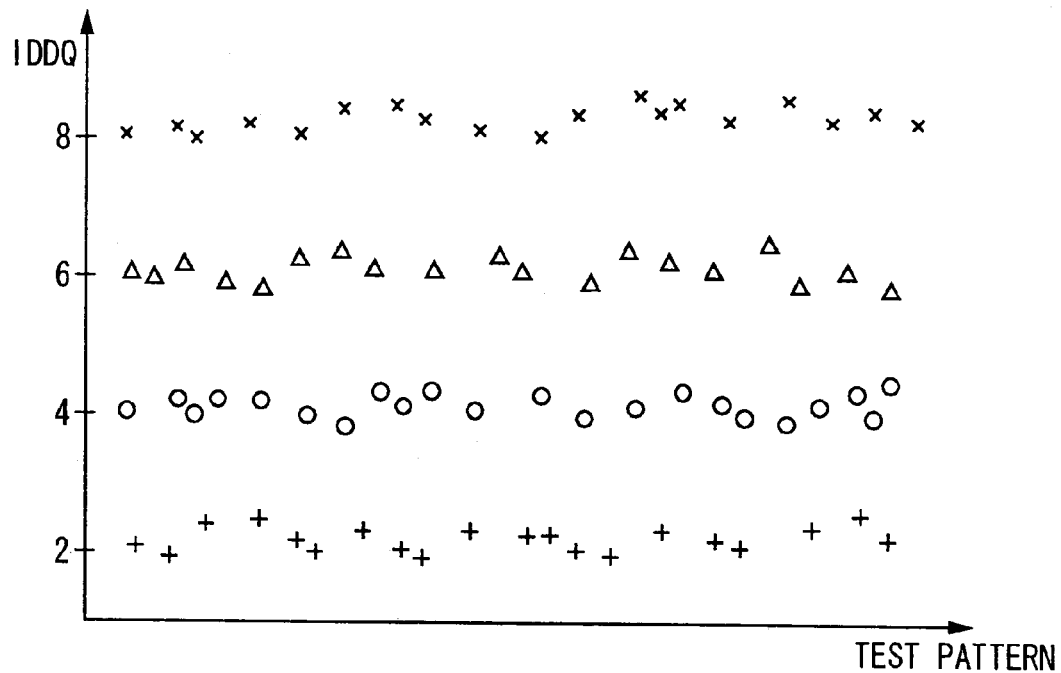
FIG. 3A shows power supply currents for each of test patterns provided sequentially.

FIG. 3A shows the power supply currents for each of the test patterns provided sequentially. As shown in FIG. 3A, the power supply current measuring unit 14 measures the power supply currents in response to the operating state of the electronic device 200 at every test pattern. In this case, the test pattern generating unit 10 generates a plurality of test patterns so that the number of the field effect transistors which are in the state of ON of the plurality of field effect transistors included in the electronic device 200 changes sequentially at every test pattern. For example, the test pattern generating unit 10 generates each of the test patterns so that the number of the field effect transistors which are in the state of ON increases by a predetermined unit number. According to FIG. 3A, the axis of abscissa shows the test patterns sorted in the order of being supplied to the electronic device 200. Accordingly, the power supply current measuring unit 14 sorts the measured power supply currents in the ascending order.

Figure 3B:
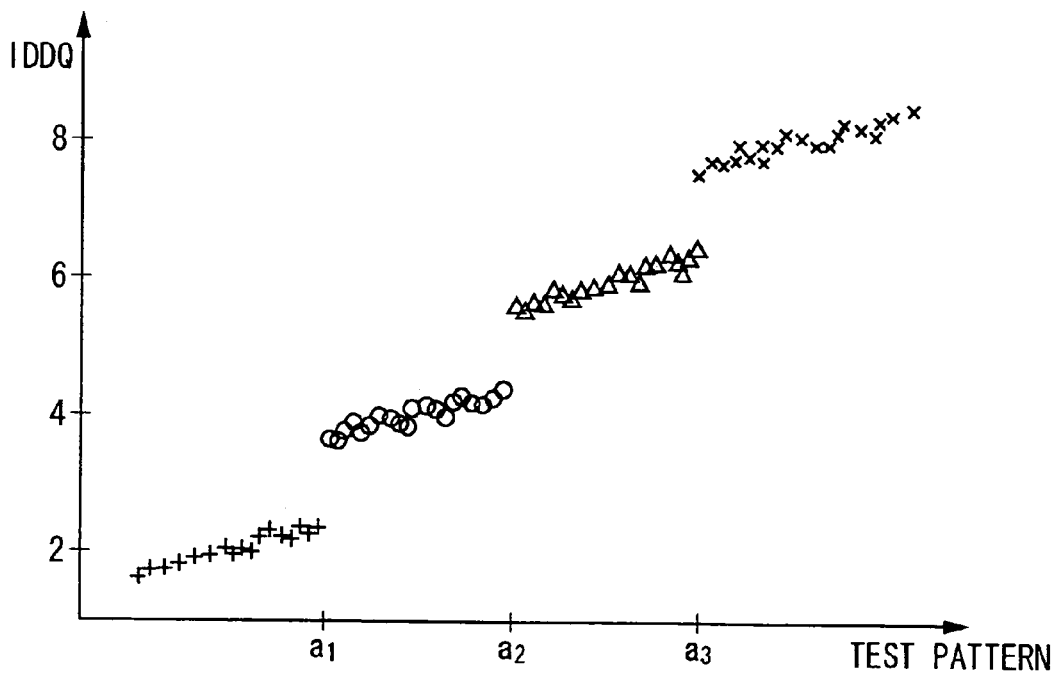
FIG. 3B shows that the measured values of the power supply current are arrayed in the ascending order of the values.

FIG. 3B shows that the measured values of the power supply current are sorted in the ascending order. In case that the number of the field effect transistors which are in the state of ON is different by the unit number at every test pattern, the measured values of the sorted power supply currents are linearly approximated. However, in case that the electronic device 200 is out of order, the measured values of the sorted power supply currents become discontinuous as shown in FIG. 3B. The power supply current measuring unit 14 detects the discontinuous portion of the measured values of the sorted power supply currents and the failure of the electronic device 200. For example, the power supply current measuring unit 14 detects a discontinuous portion by performing second-order differentiation of a waveform of the sorted power supply currents and detecting a peak of the differentiated value.

Figure 4:
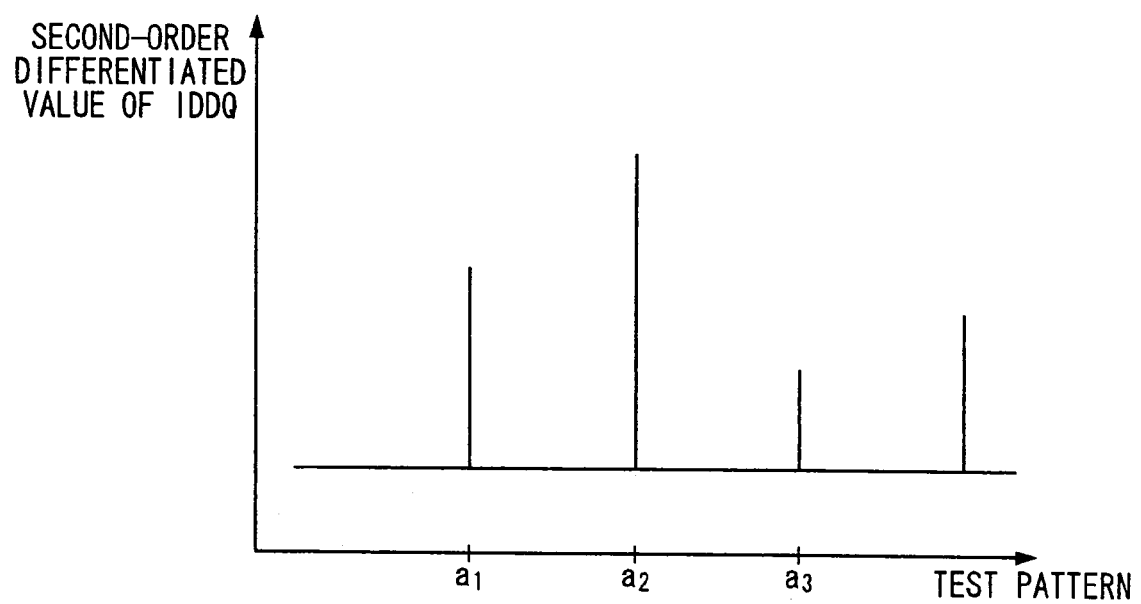
FIG. 4 shows an example of a result of performing second-order differentiation of a waveform of the arrayed power supply currents.

FIG. 4 shows an example of a result of performing second-order differentiation of the wave form of the arrayed power supply currents. As shown in FIG. 4, a peak of second-order differentiation values appears in the portion where the measured values of the power supply currents become discontinuous in FIG. 3. The power supply current measuring unit 14 may decide that the electronic device 200 is out of order in case that the values of these peaks are more than a predetermined reference value.

Further, since it takes a long time to measure the power supply current with respect to a large number of test patterns, the power supply current measuring unit 14 may measure the power supply currents with respect to a smaller number of the test patterns and decide acceptability of the electronic device 200 on the basis of these measured values of the power supply currents.

In this case, the measured values of the sorted power supply currents are approximated to a straight line by the power supply current measuring unit 14, for example, by using the least squares method. In case that the degree of coincidence between the approximated straight line and the measured values of the power supply currents is larger than a predetermined value, the electronic device 200 may be determined as acceptable. Further, in case that the degree of coincidence between the approximated straight line and the measured values of the power supply currents is less than the predetermined value, the power supply current measuring unit 14 may divide the measured values of the sorted power supply currents and linearly approximate the measured values of the power supply currents in each divided area.

Therefore, the power supply current measuring unit 14 may acquire the degree of coincidence between the approximated straight line and the power supply currents in each divided area. Further, the power supply current measuring unit 14 may compare the direction of the approximated straight line in each divided area and decide that the electronic device 200 is defective if the difference in the direction is larger than a predetermined value.

Figure 5:
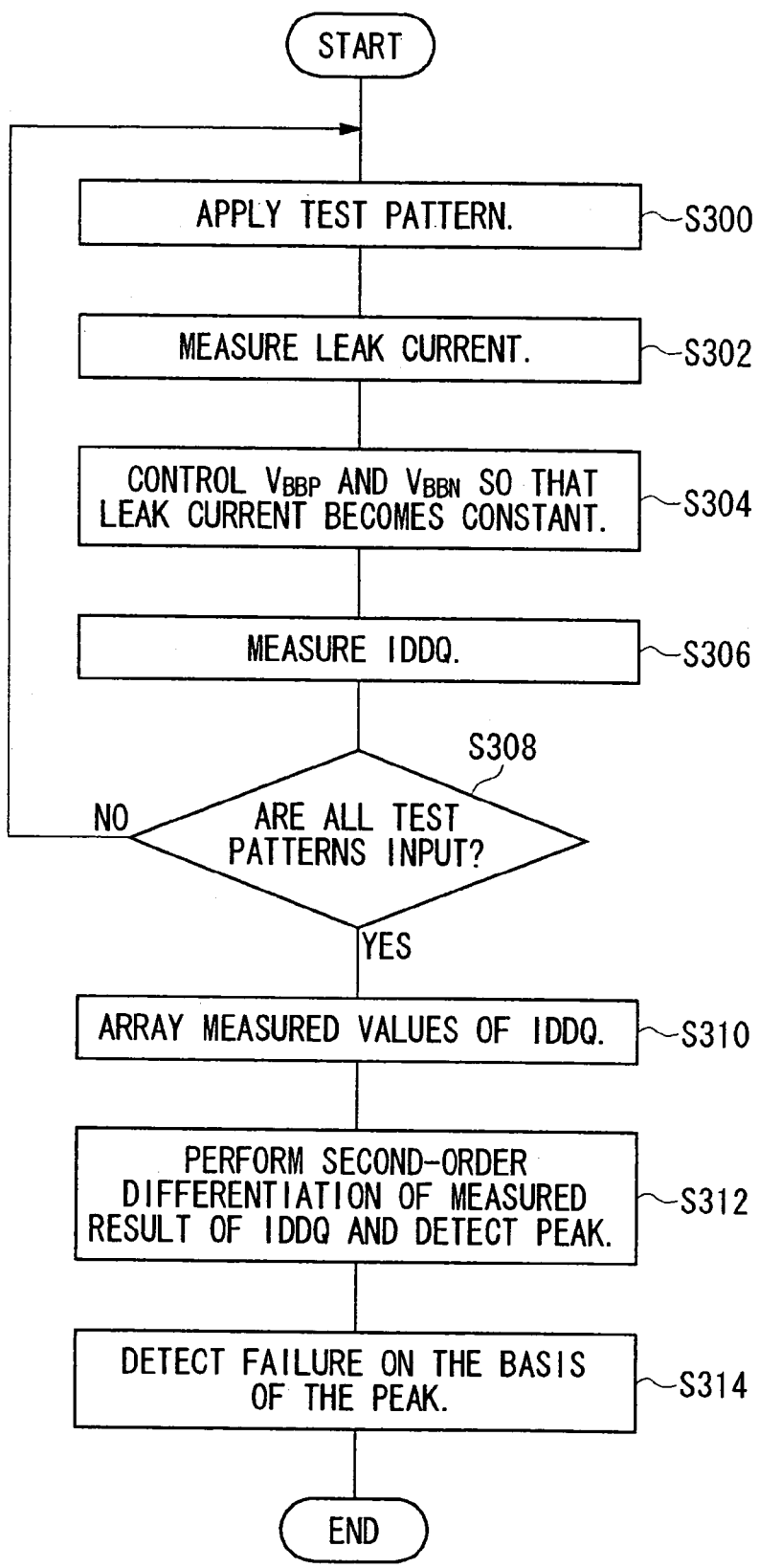
FIG. 5 is a flow chart showing an example of a test method for testing the electronic device 200 according to an embodiment of the present invention.

FIG. 5 is a flow chart showing an example of a test method for testing the electronic device 200 according to an embodiment of the present invention. The electronic device 200 may be tested by a method similar to that described with reference to FIG. 1 to FIG. 4.

According to a power supplying step, the electric power driving the electronic device 200 is provided. Then, according to a pattern generating step S300, the test pattern to be supplied to the electronic device 200 is generated and supplied to the electronic device 200.

Further, according to a leak current measuring step S302, the leak current of the field effect transistor included in the electronic device 200 is detected. According to a voltage control step S304, the voltage applied to the substrate of the electronic device 200, on which the field effect transistor is provided, is controlled so that the leak current has a predetermined value. It is desirable that the processes of S302 and S304 are always performed during the test.

Then, in a state that the leak current is kept constant, the power supply current input to the electronic device 200 is measured according to a power supply current measuring step S306. After measuring the power supply current, whether or not the measurement is finished with respect to all the test patterns applied to the electronic device 200 is determined so that, in case that there is any unmeasured test pattern, the next test pattern is generated in S300 and the processes of S300 to S306 are repeated.

In case that the measurement is finished with respect to all test patterns, according to an arraying step S310, the measured values of the power supply currents are sorted as described with reference to FIG. 3B. Therefore, according to a peak detecting step S312, second-order differentiation of the measured results of the sorted power supply currents is performed and peaks of the differentiated values are detected as described with reference to FIG. 4. According to a deciding step S314, the failure of the electronic device 200 is detected on the basis of the peaks of the differentiated values.

Figure 6:
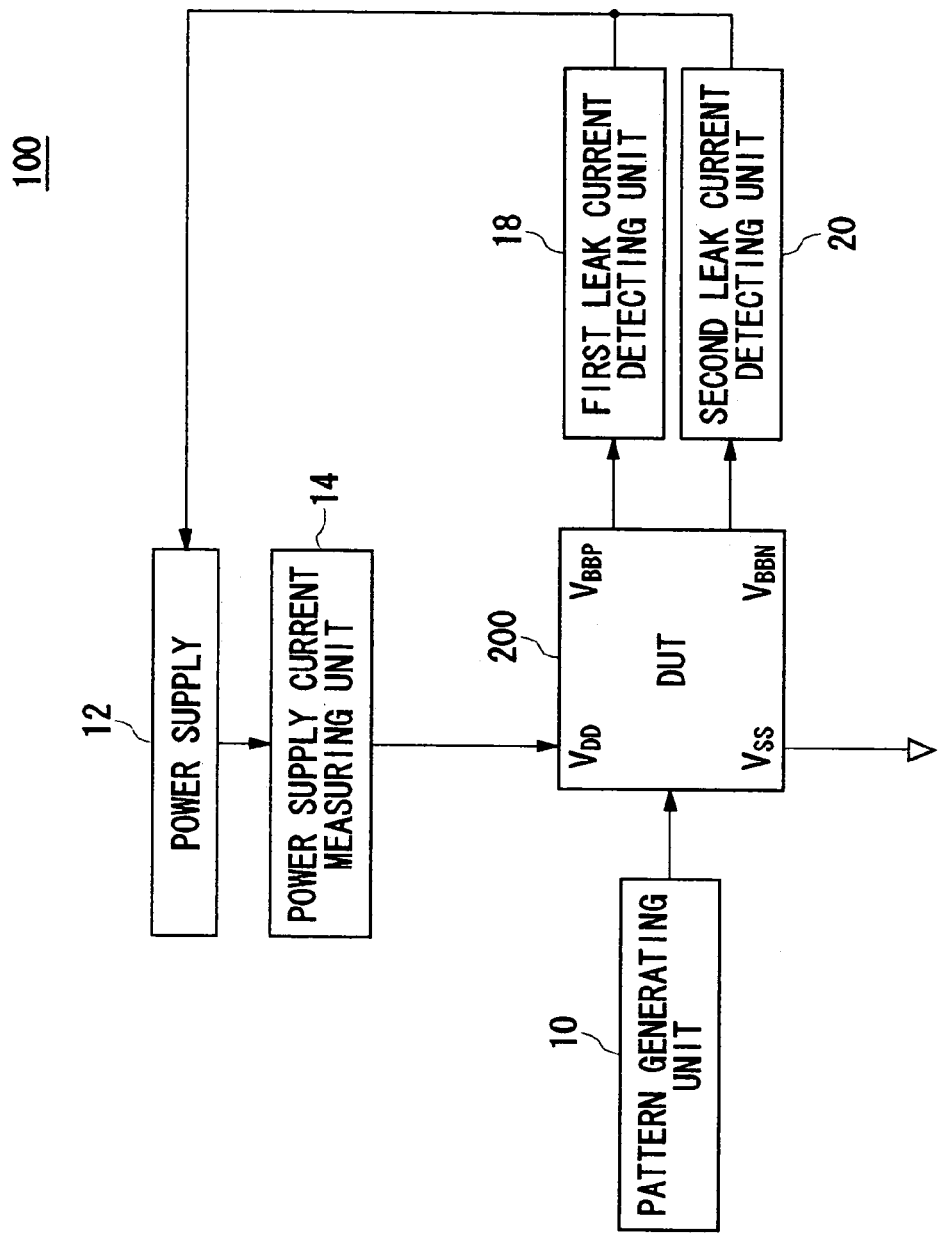
FIG. 6 shows another example of the configuration of the test apparatus 100.

FIG. 6 shows another example of the configuration of the test apparatus 100. According to the present example, the test apparatus 100 includes a pattern generating unit 10, a power supply 12, a power supply current measuring unit 14, a first leak current detecting unit 18, and a second leak current detecting unit 20.

According to the present example, the pattern generating unit 10, the power supply current measuring unit 14, the first leak current detecting unit 18, and the second leak current detecting unit 20 have the same functions as those described with reference to FIG. 1.

The power supply 12 supplies electric power driving the electronic device 200. According to the present example, the power supply 12 controls the value of the power supply voltage applied to the electronic device 200 so that the leak current detected by the first and the second leak current detecting units 18 and 20 is kept constant. According to this configuration, the influence of the leak current of the field effect transistor can be reduced and the power supply current can be measured precisely.

Figure 7:
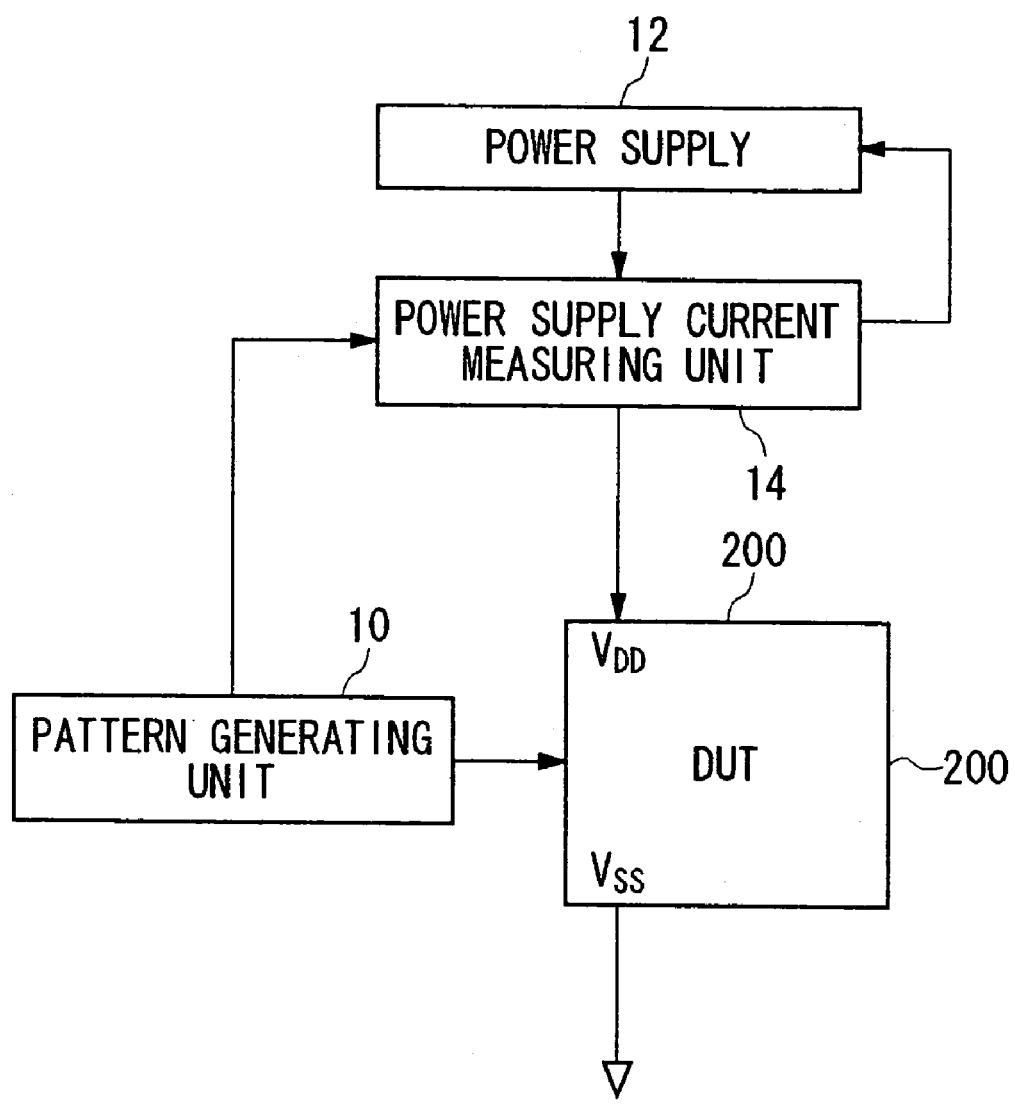
FIG. 7 shows another example of the configuration of the test apparatus 100.

FIG. 7 shows another example of the configuration of the test apparatus 100. The test apparatus 100 includes a pattern generating unit 10, a power supply 12, and a power supply current measuring unit 14. Similarly with the power supply 12 described with reference to FIG. 1, the power supply 12 provides electric power driving the electronic device 200.

Similarly with the pattern generating unit 10 described with reference to FIG. 1, the pattern generating unit 10 generates a plurality of test patterns to be supplied to the electronic device 200. Further, the pattern generating unit 10 generates reference test patterns of a predetermined pattern at every time when a predetermined number of test patterns are supplied to the electronic device 200 and supplies them to the electronic device 200. In this case, it is desirable that the pattern generating unit 10 informs the power supply current measuring unit 14 that the reference test pattern is supplied to the electronic device 200. The reference test pattern may be a reset pattern for initializing the state of each element in the electronic device 200.

The power supply current measuring unit 14 measures the power supply current input to the electronic device 200 at every time when each test pattern is applied. Further, the power supply current measuring unit 14 measures the power supply current input to the electronic device 200 in case that the reference test pattern is supplied to the electronic device 200.

Then, the power supply current measuring unit 14 controls the power supply voltage supplied to the electronic device 200 by the power supply 12 so that the power supply current supplied to the electronic device 200 in response to the reference test pattern has a predetermined value. For example, the power supply current corresponding to a first reference test pattern supplied to the electronic device 200 is set to a reference value and the power supply current measuring unit 14 controls the power supply voltage so that the power supply current coincides with the reference value at every time when the reference test pattern is supplied to the electronic device 200. The power supply current measuring unit 14 may control the power supply voltage on the basis of the measured power supply current at every time when the power supply current measuring unit 14 is informed that the reference test pattern is supplied to the electronic device 200 by the pattern generating unit 10.

According to this configuration, it is possible to detect the change of the leak current caused by external factors such as temperature change by applying the reference test pattern at every predetermined period and detecting the power supply current when the operating state of the electronic device 200 is a predetermined state. Thus, the leak current caused by the external factors can be maintained at a constant by controlling the power supply voltage to be a predetermined value.

In a state where this kind of control is performed, that is, the power supply 12 maintains the power supply voltage controlled by the power supply current measuring unit 14, the pattern generating unit 10 inputs the test patterns to the electronic device 200 and the power supply current measuring unit 14 measures the power supply current supplied to the electronic device 200 in response to the test pattern. According to this, it is possible to measure the power supply current in which the influence of the change of the leak current caused by the external factors is eliminated.

Therefore, the power supply current measuring unit 14 decides acceptability of the electronic device 200 on the basis of the power supply current measured in response to each test pattern. The method for deciding acceptability of the electronic device 200 is the same as that of the power supply current measuring unit 14 described with reference to FIG. 1. According to the test apparatus 100 in the present example, it is also possible to eliminate the influence of the change of the leak current caused by the external factors and decide acceptability of the electronic device 200 precisely.

Further, the pattern generating unit 10 may generate the usual test patterns and the reference test patterns alternately and supply them to the electronic device 200. In this case, since the change of the leak current is eliminated at every time when the power supply current corresponding to each test pattern is measured, it is possible to perform the measurement more precisely.

Figure 8:
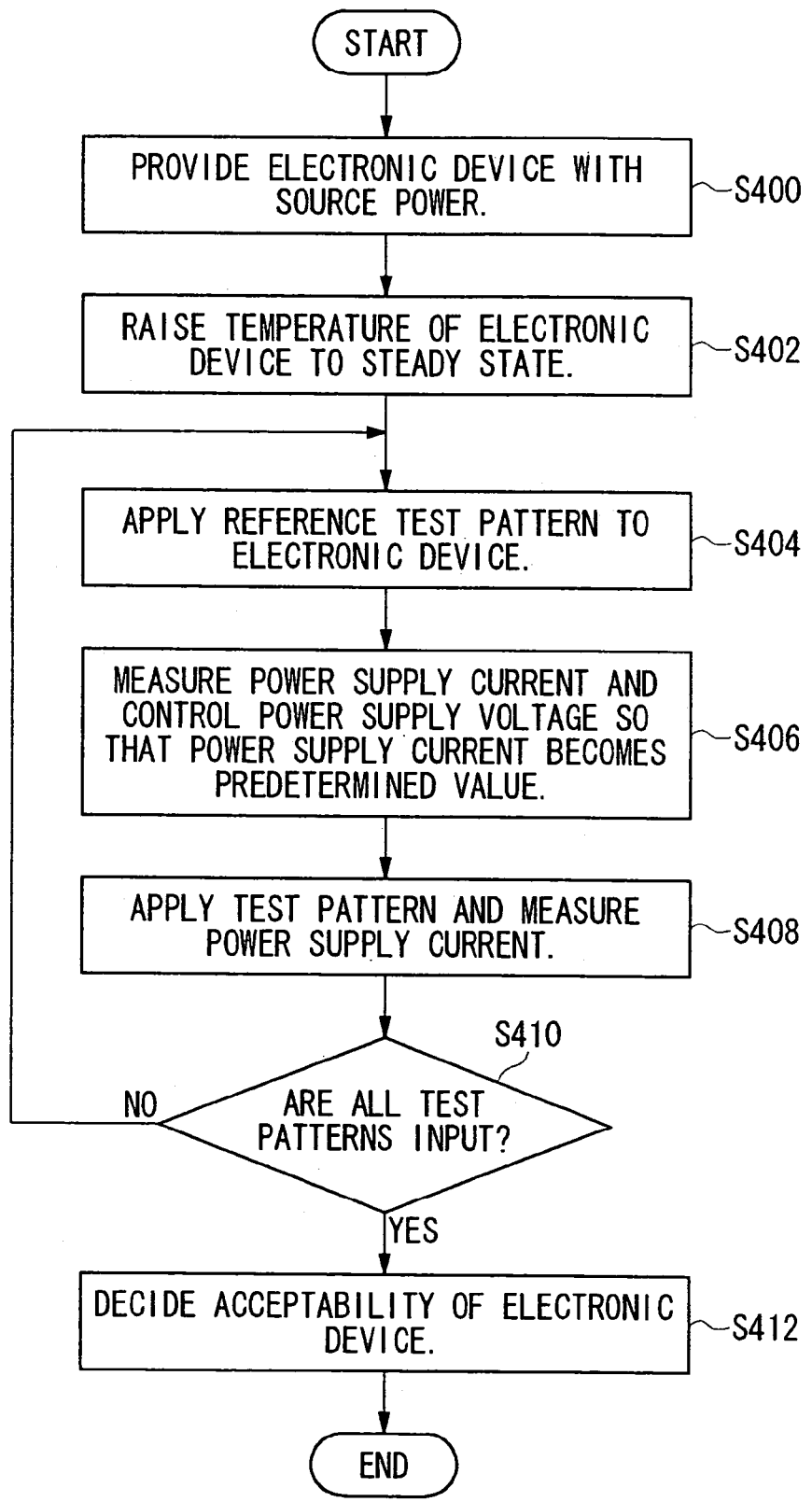
FIG. 8 is a flow chart showing another example of the test method.

FIG. 8 is a flow chart showing another example of the test method. The electronic device 200 may be tested by a method similar to that described with reference to FIG. 8.

According to a power supplying step S400, the electric power driving the electronic device 200 is supplied. Then, according to a temperature control step S402, the temperature of the electronic device 200 is raised to a steady state. For example, the temperature of the electronic device 200 is raised by repeatedly inputting proper test patterns to the electronic device 200 by the pattern generating unit 10.

According to a reference test pattern generating step S404, the reference test pattern of a predetermined pattern is generated. Therefore, according to a reference current measuring and power supply voltage control step S406, the power supply current in case that the reference test pattern is supplied to the electronic device 200 is measured. Further, according to S406, the power supply voltage generated during S400 is controlled so that the measured power supply current has a predetermined value.

According to a pattern generating and power supply current measuring step S408, the test pattern to be supplied to the electronic device 200 is applied and the power supply current at that time is measured. Therefore, in case that the power supply currents are not measured with respect to all the test patterns to be applied, the processes of S404 to S408 are repeated and in case that the power supply currents are measured with respect to all the test patterns, the acceptability of the electronic device 200 is decided on the basis of the measured power supply currents (S402).

As obvious from the description above, according to the present invention, it is possible to eliminate the change of the sub-threshold leak current of the field effect transistor included in the electronic device 200 and measure the power supply current of the electronic device 200 precisely. Thus, it is possible to test the electronic device 200 precisely.

Although the present invention has been described by way of exemplary embodiments, it should be understood that those skilled in the art might make many changes and substitutions without departing from the spirit and the scope of the present invention which is defined only by the appended claims.

What is claimed is:

1. A test apparatus for testing an electronic device provided with a field effect transistor, which operates in response to a given test pattern, comprising:
    a power supply for providing electric power which drives the electronic device;
    a pattern generating unit for generating a plurality of test patterns sequentially and providing the electronic device with the test patterns;
    a leak current detecting unit for detecting a leak current of the field effect transistor;
    a voltage control unit for controlling a substrate voltage applied to a substrate on which the field effect transistor is provided, in order to maintain the leak current detected by said leak current detecting unit at a predetermined value; and
    a power supply current measuring unit for measuring a power supply current input to the electronic device at every time when each of the test patterns is applied and deciding acceptability of the electronic device on the basis of the measured power supply currents.

2. A test apparatus as claimed in claim 1, wherein said leak current detecting unit measures a p-type leak current of the field effect transistor of p-type and an n-type leak current of the field effect transistor of n-type, and
    said voltage control unit controls a high voltage applied to the substrate on the basis of the p-type leak current and a low voltage applied to the substrate on the basis of the n-type leak current.

3. A test apparatus as claimed in claim 1, wherein said power supply current measuring unit arrays the measured power supply currents with respect to each of the test patterns in the order of the magnitude of each of the power supply currents and decides that the electronic device is defective in case that the arrayed power supply currents are discontinuous.

4. A test apparatus as claimed in claim 3, wherein said power supply current measuring unit performs second-order differentiation of the arrayed power supply currents and decides that the electronic device is defective in case that a peak of the differentiated value is larger than a predetermined value.

5. A test apparatus as claimed in claim 3, wherein said power supply current measuring unit acquires differences between two adjacent power supply currents of the arrayed power supply currents and decides that the electronic device is defective in case that there is any acquired difference which is larger than a predetermined value.

* * * * *